United States Patent [19]

Fukunaga

[11] Patent Number: 5,077,595

[45] Date of Patent: Dec. 31, 1991

[54] SEMICONDUCTOR DEVICE

[75] Inventor: Masanori Fukunaga, Fukuoka, Japan

[73] Assignee: Mitsubishi Denki Kabushiki Kaisha, Tokyo, Japan

[21] Appl. No.: 575,661

[22] Filed: Aug. 31, 1990

[30] Foreign Application Priority Data

Jan. 25, 1990 [JP] Japan .................. 2-16653

[51] Int. Cl.$^5$ .................. H01L 27/02; H01L 23/16
[52] U.S. Cl. .................. 357/40; 357/75
[58] Field of Search .................. 357/52, 53, 74, 75, 357/80, 84, 54, 41, 40

[56] References Cited

U.S. PATENT DOCUMENTS

| 4,847,603 | 7/1989 | Blanchard | 340/705 |
| 4,851,831 | 7/1989 | Stern | 340/870.16 |
| 4,945,396 | 7/1990 | Shigekane et al. | 357/46 |

FOREIGN PATENT DOCUMENTS

| 62-277750 | 12/1987 | Japan . | |
| 63-124555 | 5/1988 | Japan | 357/80 |

Primary Examiner—Mark Prenty
Assistant Examiner—D. Morin
Attorney, Agent, or Firm—Oblon, Spivak, McClelland, Maier & Neustadt

[57] ABSTRACT

On an insulating layer (32) formed on a metal substrate (31), cascode-connected power switching elements (1-6) are provided and shield patterns (101-104) are formed. Control circuits (13-18) for the switching elements (1-6) are formed on insulating layers (105, 106) formed on the shield patterns (101-104) which are fixed to potentials responsive to potentials of output electrodes of the corresponding switching elements (1-6). The control circuits (13-18) and the corresponding shield patterns (101-104) are in capacity coupling. Thus, noise arises in the control circuits (13-18) with respect to the metal substrate (31) when noise is applied to current paths of the switching elements (1-6) with respect to the metal substrate (31). As a result, viewing from the output electrodes of the switching elements (1-6), the control circuits (13-18) have noise equivalent to nothing.

10 Claims, 8 Drawing Sheets

SEMICONDUCTOR DEVICE

BACKGROUND OF THE INVENTION

1. Field of the Invention

The present invention relates to a semiconductor device, and more particularly, it relates to a prevention of malfunctions caused by noise or the like in a bridge power switching device and its control circuit modularized on a single metal substrate.

2. Description of the Background Art

FIG. 1 is a circuit diagram showing a conventional three-phase bridge inverter circuit for driving a motor or the like. The inverter circuit includes six power NPN transistors 1 to 6. The transistors 1 and 2, 3 and 4, and 5 and 6 are connected like totem poles, respectively, and connected in parallel between power source terminals P and N. Between the power source terminals P and N, high voltage which is positive on a terminal P side is applied. A junction of an emitter of the transistor 1 and a collector of the transistor 2 is connected to a U-phase output terminal U, a junction of an emitter of the transistor 3 and a collector of the transistor 4 is connected to a V-phase output terminal V, and a junction of an emitter of the transistor 5 and a collector of the transistor 6 is connected to a W-phase output terminal W. Between the emitters and collectors of the transistors 1 to 6, flywheel diodes 7 to 12 are connected, respectively.

Control circuits 13 to 18 to control turning-ON/OFF of the transistors 1 to 6 are connected to bases of the transistors 1 to 6, respectively. The control circuits 13 to 18 include drivers 25 to 30 which receive control signals applied to input terminals 19 to 24 to produce base drive signals of the transistors 1 to 6. The transistors 1 to 6 turn ON/OFF in response to the control signals inputted to the input terminals 19 to 24. The control circuits 13 to 18 also include protection circuits which detect over current, over voltage, overheating and the like to afford appropriate protection, as required. Furthermore, the control circuits 13, 15 and 17 on an upper arm side also include interface circuits, such as photocouplers and the like, for shifting control signals at a low voltage level applied to the input terminals 19, 21 and 23 to a high voltage level. Each of the control circuits 13 to 18 is composed of an IC, discrete transistors, resistances, capacitors and the like. The control circuits 13, 15 and 17 on the upper arm side have their respective power sources $V_{UP}$, $V_{VP}$ and $V_{WP}$, while the control circuits 14, 16 and 18 on a lower arm side have a common power source $V_N$.

The circuit in FIG. 1 is modularized on a single metal substrate, except for $V_{UP}$, $V_{VP}$, $V_{WP}$ and $V_N$. Boosting voltage of the power source $V_N$ on the lower arm side with a charge pump circuit formed on the metal substrate, the power sources $V_{UP}$, $V_{VP}$ and $V_{WP}$ on the upper arm side can be made in the module.

FIG. 2 is a sectional view showing a structure of a U-phase part when the circuit in FIG. 1 is formed on a single metal substrate. An insulating layer 32 is formed on an aluminum substrate 31, and a copper pattern 33 similar to a wiring pattern of a printed wiring board is formed thereon. The power transistors 1, 2 and the control circuits 13, 14 are fixed on the copper pattern 33 by soldering or the like. Aluminum wires 34, 35 are base wires, while aluminum wires 36, 37 are emitter wires. The copper patterns 33 are appropriately connected but not shown, and a part of the connections is equivalently shown with connection lines 38, 39. In this way, the U-phase circuitry in FIG. 1 is formed on the single aluminum substrate 31, and connected to external elements through external terminals U, N, P, 19 and 20 formed on the aluminum substrate 31.

FIG. 3 is a sectional view showing an enlarged portion on the upper arm side in FIG. 2. Since the copper pattern 33 and the aluminum substrate 31 are opposed to each other with the insulating layer 32 interposed therebetween, capacities are formed therebetween. In other words, the copper pattern 33 is in capacity coupling to the aluminum substrate 31. In FIG. 3, a capacity between a copper pattern 33a to which the output terminal U (i.e., the emitter of the power transistor 1, the collector of the power transistor 2 and a minus side of the power source $V_{UP}$) is connected and the aluminum substrate 31, and a capacity between a copper pattern 33b to which the input terminal 19 is connected and the aluminum substrate 31 are represented as C1 and C2, respectively. A capacity between the copper patterns 33a and 33b is represented as C3. A terminal S connected to the aluminum substrate 31 is shown only for convenience of explanation.

Now, the capacities C1, C2 and C3 alone should be noticed for discussing what kind of influence noise applied between the terminals U and S exerts upon the terminal 19, and the other capacities are neglected.

FIG. 4 is an equivalent circuit diagram with the capacities C1, C2 and C3. Since the copper pattern 33a is larger than the copper pattern 33b in area, the capacity C1 is larger than the capacity C2. The capacity C3 is very small compared with the capacities C1 and C2 because it is a capacity between the patterns. Thus, the following relations are obtained.

$$C1 > C2 > > C3 \tag{1}$$

Now assume that dV/dt (U) is applied to the terminal U with respect to the terminal S as noise. At this time, noise dV/dt (19) applied to the terminal 19 with respect to the terminal U can be expressed by an equation as follows:

$$\frac{dV}{dt}(19) = \frac{dV}{dt}(U) \cdot \frac{C2}{C2 + C3} \tag{2}$$

From the relation of the equation (1), the following formula is obtained:

$$\frac{dV}{dt}(19) \approx \frac{dV}{dt}(U) \tag{3}$$

Thus, noise arises in the terminal 19 with respect to the terminal U to the same extent as in the terminal U with respect to the terminal S. As will be apparent from FIG. 1, the terminal U is an output terminal connected to the output electrode (emitter) of the power transistor 1 and applies reference potential of the control circuit 13 of the power transistor 1. On the other hand, the terminal 19 is an input terminal of the control circuit 13. There is the problem that malfunctions are caused in the control circuit 13 because noise arises in the terminal 19 applying a control input for the control circuit 13, with respect to the terminal U applying reference potential of the control circuit 13. Such noise arises not only in the input terminal 19 but in various signal paths in the control circuit 13 and causes malfunctions, for example, erroneously exercising protection functions (protecting from over current, over voltage and the like). Such a disadvantage is also caused when noise is applied to the terminals V, W, P and N (i.e., current paths in the power transistors 1 to 6) with respect to the aluminum substrate 31.

SUMMARY OF THE INVENTION

A semiconductor device in accordance with the present invention comprises a metal substrate, a first insulating layer formed on the metal substrate, first and second power switching elements formed on the first insulating layer and connected to each other like a totem pole, first and second shield patterns composed of conductors formed on the first insulating layer, a second insulating layer formed on the first shield pattern, a third insulating layer formed on the second shield pattern, a first control circuit formed on the second insulating layer for turning the first power switching element ON/OFF, a second control circuit formed on the third insulating layer for turning the second power switching element ON/OFF, first connecting means for connecting the first shield pattern to a first node of a potential responsive to a potential of an output electrode of the first power switching element, and second connecting means for connecting the second shield pattern to a second node of a potential responsive to a potential of an output electrode of the second power switching element.

According to the present invention, first and second control circuits are formed on a metal substrate through a first insulating layer, first and second shield patterns and second and third insulating layers, respectively, and hence, the first and second control circuits are not directly in capacity coupling to the metal substrate. On the other hand, capacities between the first and second control circuits and first and second shield patterns are large. The first and second shield patterns are fixed to potentials in accordance with potentials of output electrodes of first and second power switching elements, respectively, and therefore, when noise is applied to current paths of the first and second power switching elements with respect to the metal substrate, noise arises in the control circuits with respect to the metal substrate. As a result, viewing from the output electrodes of the first and second power switching elements, control circuits have noise equivalent to nothing, and thus, the malfunctions of the control circuits can be avoided.

Accordingly, it is an object of the present invention to provide a semiconductor device composed of bridge power switching devices and their respective control circuits disposed on a metal substrate, which never causes malfunctions due to noise.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
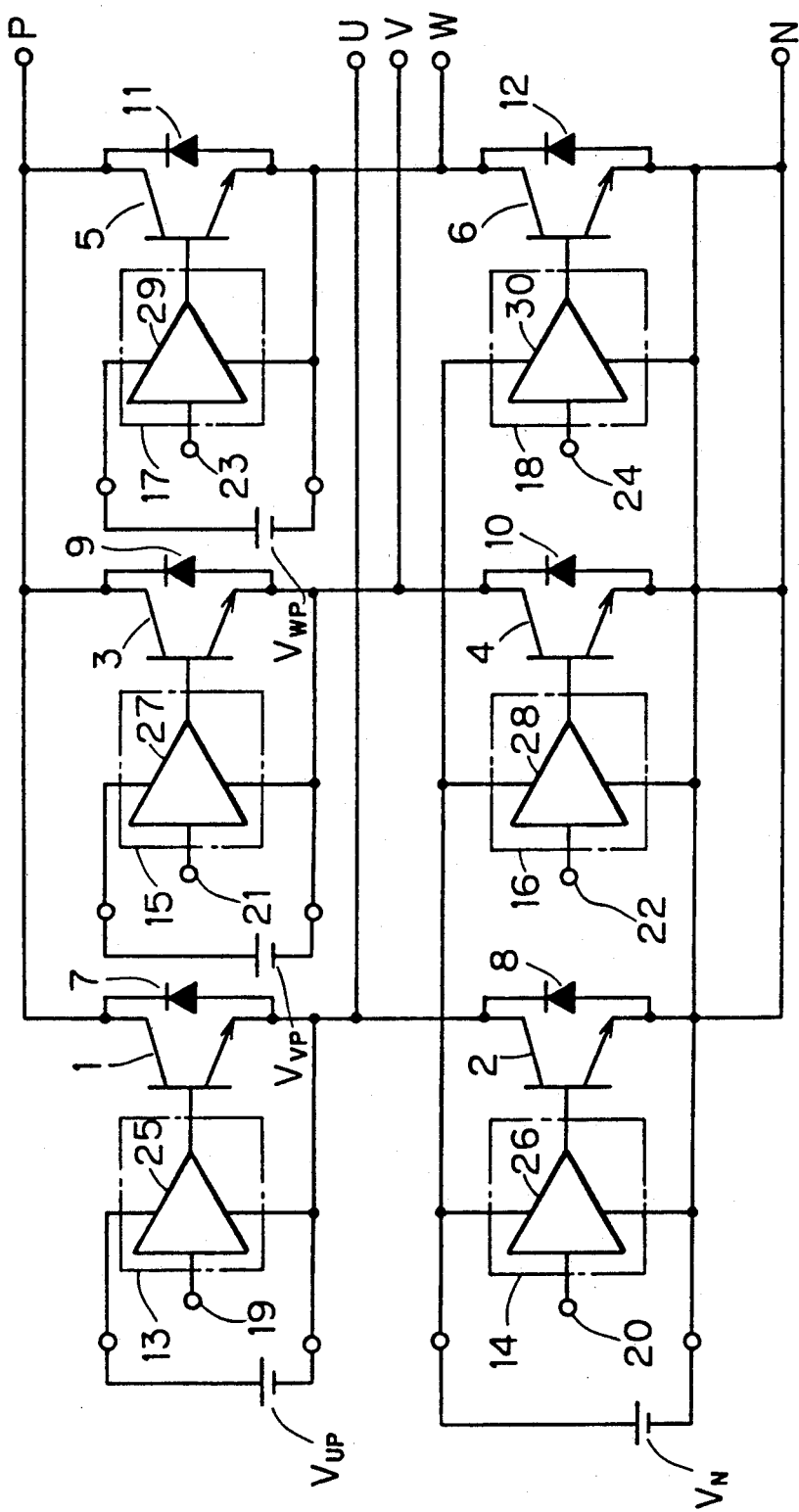
FIG. 1 is a circuit diagram showing a conventional three-phase bridge inverter circuit.
Figure 2:
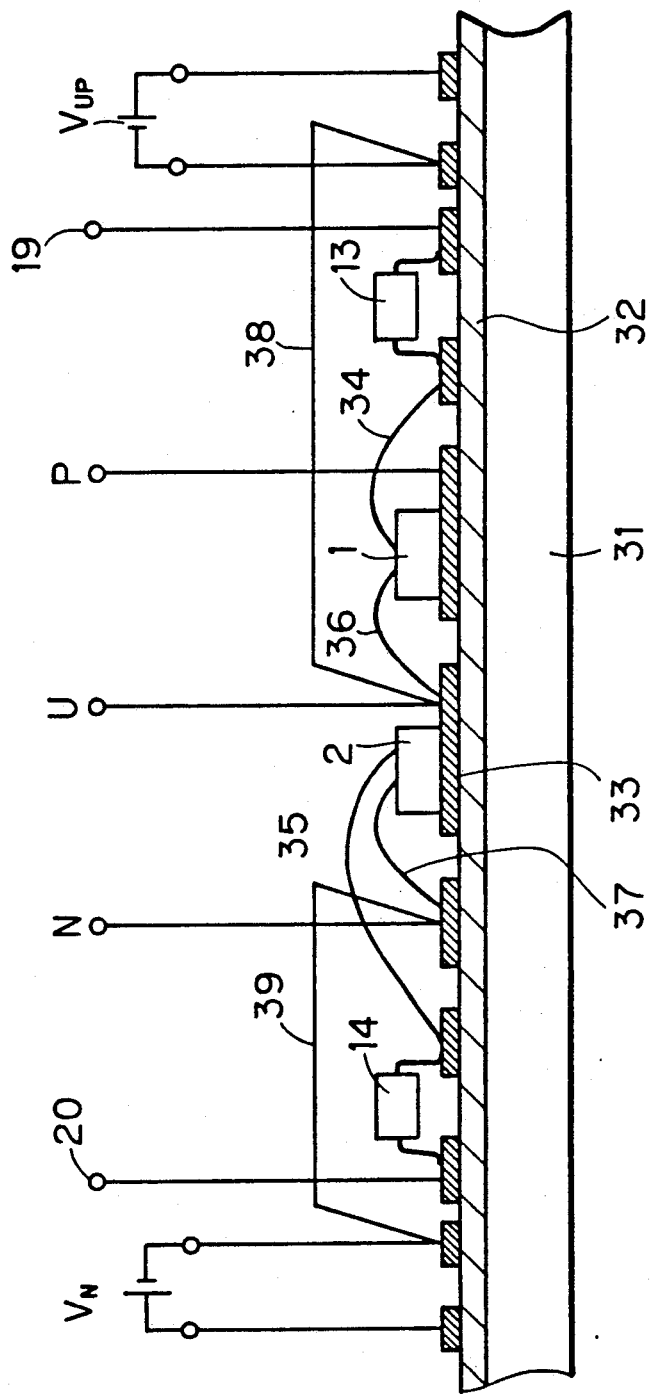
FIG. 2 is a sectional view showing a structure of U-phase circuitry in the case where the circuit in FIG. 1 is formed on a metal substrate.
Figure 3:
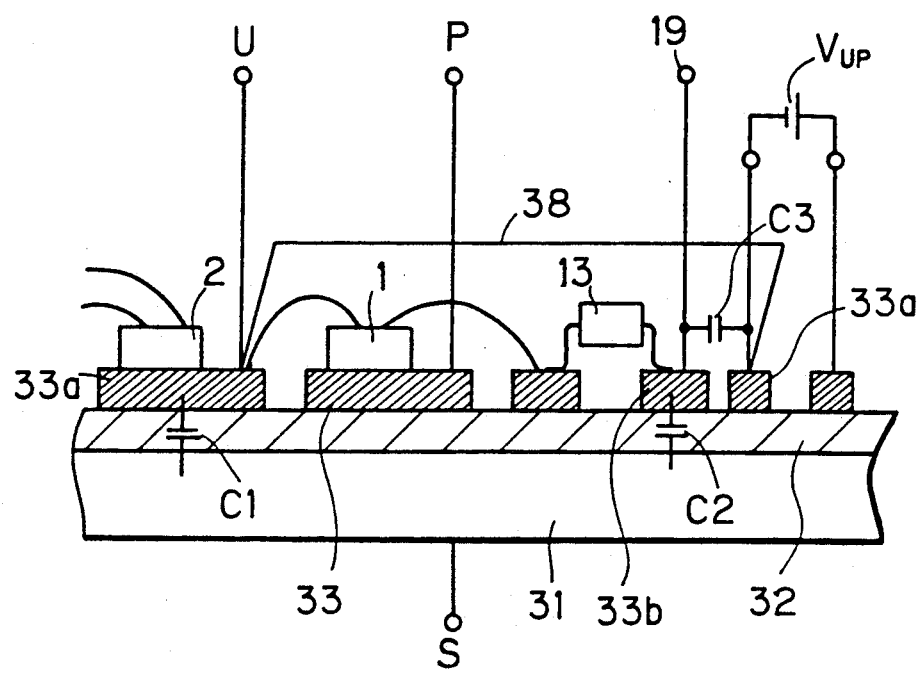
FIG. 3 is a sectional view showing an enlarged portion of an upper arm side in FIG. 2.
Figure 4:
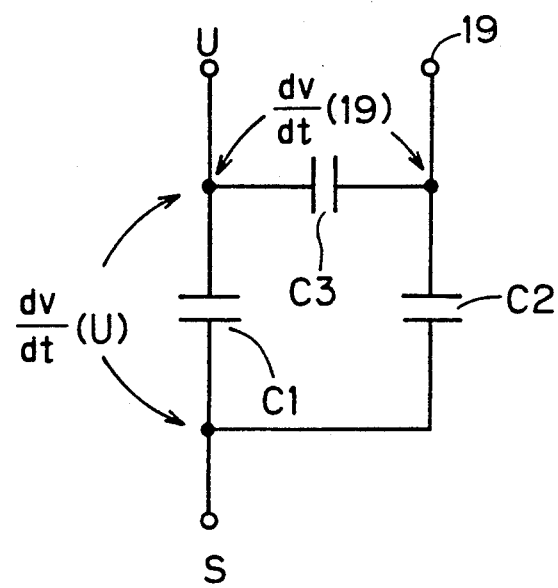
FIG. 4 is an equivalent circuit diagram showing coupling capacities.
Figure 5:
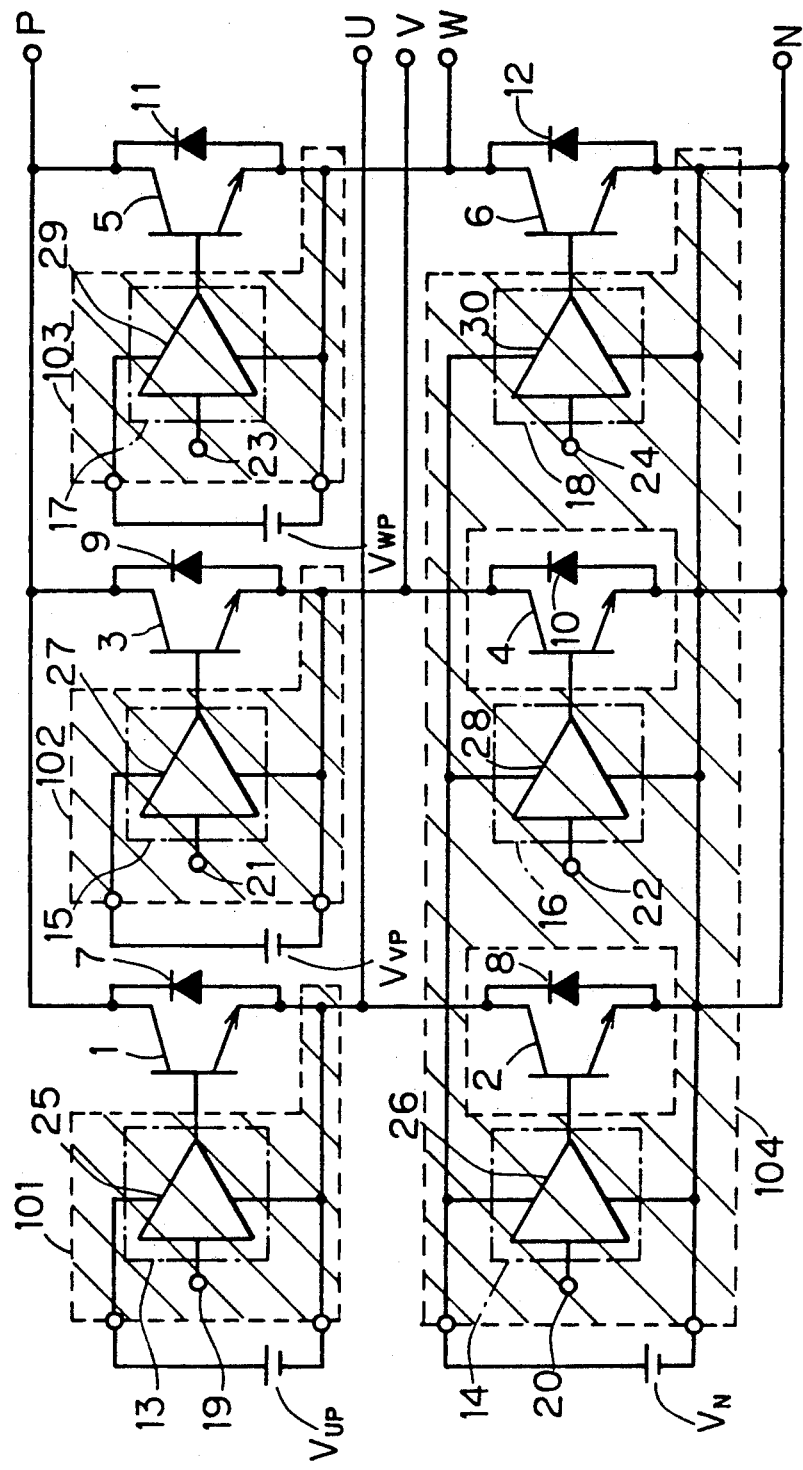
FIG. 5 is a circuit diagram showing a three-phase bridge inverter circuit of an embodiment of a semiconductor device according to the present invention.

FIG. 5 is a circuit diagram showing a three-phase bridge inverter circuit of an embodiment of a semiconductor device according to the present invention. Its circuit structure is the same as that of the aforementioned conventional inverter circuit, and the explanation will be omitted.

In this embodiment, control circuits 13, 15 and 17 on an upper arm side are formed on individual shield patterns 101, 102 and 103, respectively. Control circuits 14, 16 and 18 on a lower arm side are formed on a common shield pattern 104. The shield patterns 101, 102 and 103 are fixed to potentials of output terminals U, V and W (i.e., potentials of output electrodes (emitters) of power transistors 1, 3 and 5), respectively, while the shield pattern 104 is fixed to a potential of a power source terminal N (a potential of output electrodes (emitters) of power transistors 2, 4 and 6). The control circuits 13, 15 and 17 operate with the emitter potentials of the power transistors 1, 3 and 5 applied as references, respectively, while the control circuits 14, 16 and 18 operate with the common emitter potential of the power transistors 2, 4 and 6 applied as a reference, and hence the potentials of the shield patterns 101, 102 and 103 are kept at the same potentials as the reference potentials of the control circuits 13, 15 and 17, respectively, while the potential of the shield pattern 104 is kept at the same potential as the common reference potential of the control circuits 14, 16 and 18.

Figure 6:
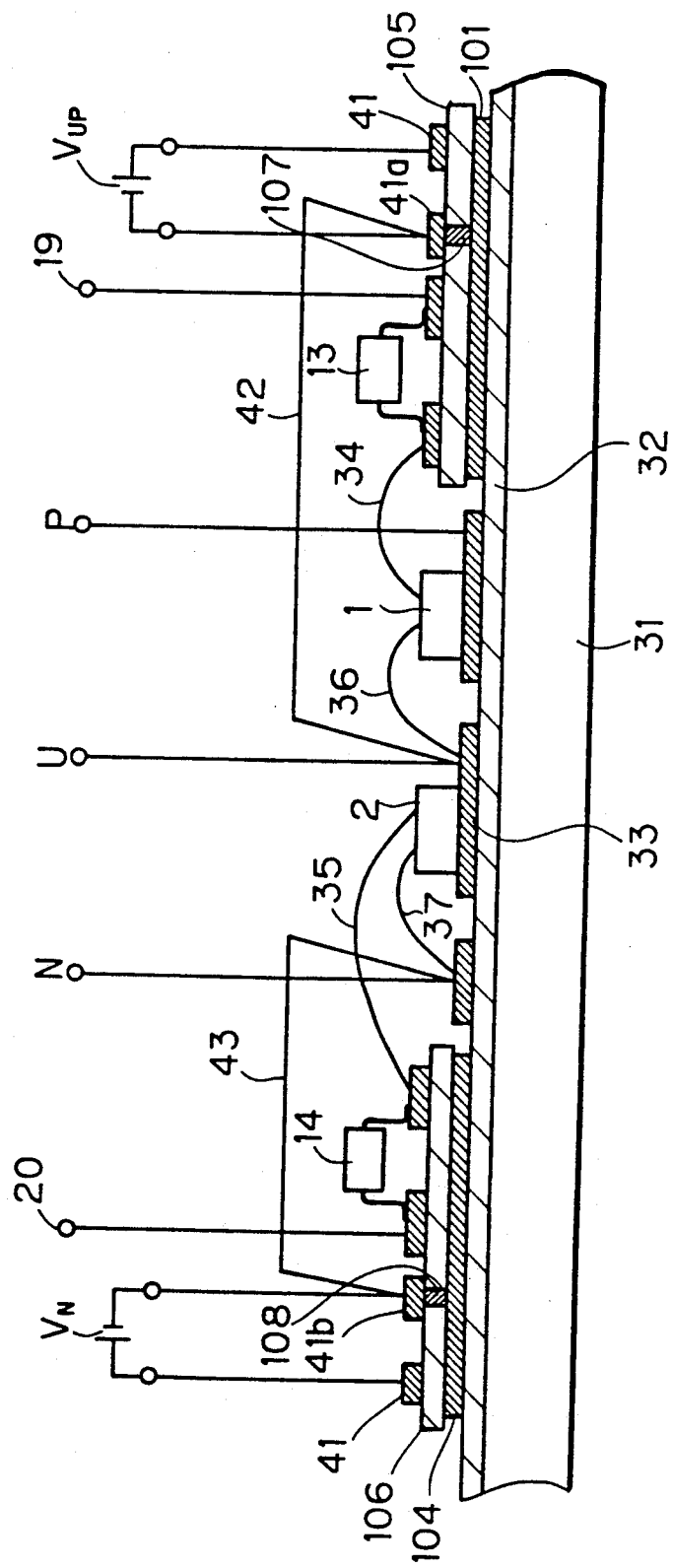
FIG. 6 is a sectional view showing a structure of U-phase circuitry when the circuit in FIG. 5 is formed on a metal substrate.

FIG. 6 is a sectional view showing a structure of a U-phase part when the circuit in FIG. 5 is formed on a single metal substrate. An insulating layer 32 is formed on an aluminum substrate 31, and a copper pattern 33 and the shield patterns 101 and 104 similar to a wiring pattern of a printed wiring board are formed thereon. The shield patterns 101 and 104 are also copper patterns similar to the copper pattern 33. The copper pattern 33 may have the same thickness as the shield patterns 101 and 104, or may be thicker. When they all have the same thickness, they can be simultaneously formed.

Insulating layers 105 and 106 are formed on the shield patterns 101 and 104, respectively, and a copper pattern 41 similar to the copper pattern 33 is formed thereon. The power transistors 1 and 2 are fixed on the copper pattern 33 by soldering or the like as has conventionally been done, while the control circuits 13 and 14 are fixed on the copper pattern 41 by soldering or the like. The insulating layer 105 is provided with a through hole 107, and through this through hole, a copper pattern 41a connected to a minus side of a power source $V_{UP}$ (i.e., an output electrode (emitter) side of the power transistor 1) and the shield pattern 101 are connected. The insulating layer 106 is provided with a through hole 108, and through the through hole 108, a copper pattern 41b connected to a minus side of a power source $V_N$ (i.e., an output electrode (emitter) side of the power transistor 2) and the shield pattern 104 are connected.

Aluminum wires 34 and 35 are base wires, while aluminum wires 36 and 37 are emitter wires. The copper patterns 33 or the copper patterns 41 are appropriately connected but not shown, or the copper patterns 33 and 41 can be appropriately connected by aluminum wire or the like. A part of those connections are equivalently shown as connecting lines 42 and 43. In this way, the U-phase circuitry in FIG. 5 is formed on the single aluminum substrate 31 and connected to external elements through external terminals U, N, P, 19 and 20 formed on the aluminum substrate 31. The external terminals U, N, P are formed on the insulating layer 32, while the external terminals 19 and 20 are formed on the insulating layers 101 and 104, respectively.

Figure 7:
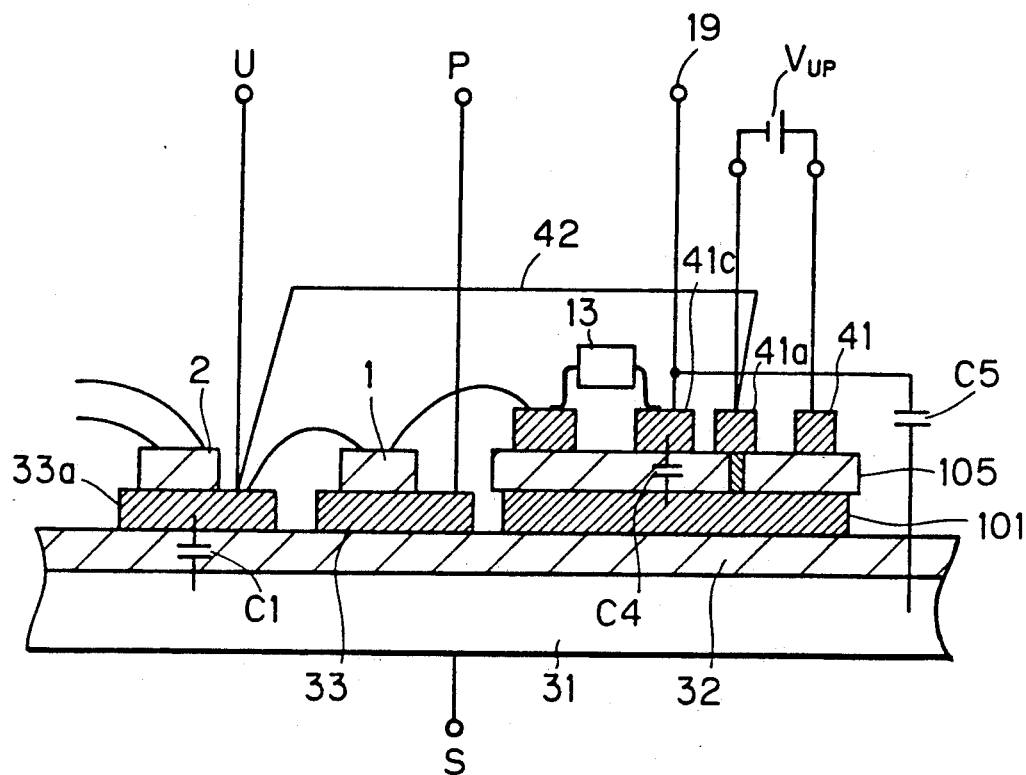
FIG. 7 is a sectional view showing an enlarged portion on an upper arm side in FIG. 6.

FIG. 7 is a sectional view showing an enlarged portion on an upper arm side in FIG. 6. Since the copper pattern 33 and the aluminum substrate 31 are opposed to each other with the insulating layer interposed therebetween, a capacity is formed therebetween. Also, since the copper pattern 41 and the shield pattern 101 are opposed with the insulating layer 105 interposed therebetween, a capacity is formed therebetween. In FIG. 7, a capacity between a copper pattern 33a to which the output terminal U (i.e., the emitter of the power transistor 1, the collector of the power transistor 2 and a minus side of the power source $V_{UP}$) is connected and the aluminum substrate 31 is represented as C1. The capacity C1 contains a capacity between the shield pattern 101 and the aluminum substrate 31 because the potential of the shield pattern 101 is the same as that of the output terminal U. A capacity between a copper pattern 41c to which the input terminal 19 is connected and the shield pattern 101 is represented as C4. Furthermore, a capacity by which the copper pattern 41c and the aluminum substrate 31 are directly in capacity coupling to each other is represented as C5. A terminal S connected to the aluminum substrate 31 is only for convenience of explanation. Now, the capacities C1, C4 and C5 alone should be noticed for discussing what kind of influence noise applied between the terminals U and S exerts on the terminal 19, and the other capacities are neglected.

Figure 8:
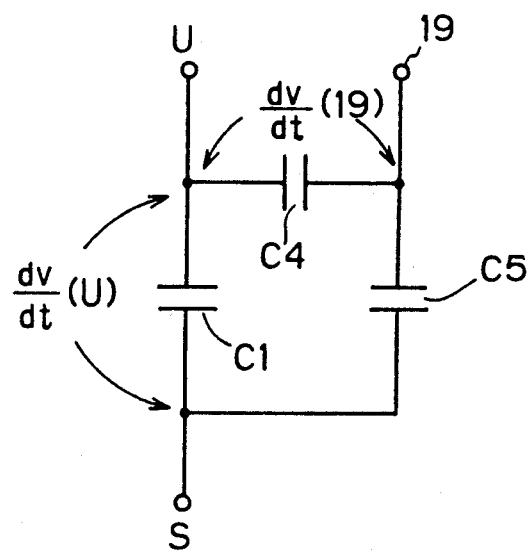
FIG. 8 is an equivalent circuit diagram showing coupling capacities.

FIG. 8 is an equivalent circuit diagram showing the capacities C1, C4 and C5. The total area of the copper pattern 33a and the shield pattern 101 is larger than that of the copper pattern 41c, and hence the capacity C1 is larger than the capacity C4. The capacity C5 is a capacity of a direct capacity coupling of the copper pattern 41c to the aluminum substrate 31, but since the shield pattern 101 is interposed between the copper pattern 41c and the aluminum substrate 31 to inhibit a direct capacity coupling, the capacity C5 is substantially zero. Thus, the following relations are obtained:

$$C1 > C4 >> C5 \approx 0 \qquad (4)$$

Now assume that dV/dt (U) is applied to the terminal U with respect to the terminal S as noise. At this time, noise dV/dt (19) applied to the terminal 19 with respect to the terminal U can be expressed by an equation as follows:

$$\frac{dV}{dt}(19) = \frac{dV}{dt}(U) \cdot \frac{C5}{C4 + C5} \qquad (5)$$

From the relations of the equation (4), the following formula is obtained:

$$\frac{dV}{dt}(19) \approx 0 \qquad (3)$$

Thus, even if noise is applied to the terminal U with respect to the terminal S, noise never arises in the terminal 19 with respect to the terminal U. In other words, since a potential of the shield pattern 101 is kept at the same value as that of the terminal U, the potential of the shield pattern 101 is varied when noise arises in the terminal U with respect to the terminal S (i.e., the aluminum substrate 31), and accordingly, in response to this, a potential of the copper pattern 41c (i.e., the terminal 19) which is in capacity coupling to the shield pattern 101 is also varied. Thus, viewing from the terminal U, the terminal 19 has noise equivalent to nothing.

The terminal U is an output terminal connected to the output electrode (emitter) of the power transistor 1 and applies reference potential of the control circuit 13 of the power transistor 1. On the other hand, the terminal 19 is an input terminal of the control circuit 13. Even if noise is applied to the terminal U with respect to the aluminum substrate 31, no malfunctions are caused in the control circuit 13 because noise never arises in the terminal 19 applying a control input of the control circuit 13 with respect to the terminal U applying the reference potential of the control circuit 13.

Moreover, noise never arises not only in the input terminal 19 but in various signal paths of the control circuit 13 formed on the shield pattern 101, and hence malfunctions, for example, erroneously exercising protection functions (protecting from excess current, excess voltage and the like), can be avoided. It is the same with other control circuits 14 to 18.

Furthermore, when noise is applied to the terminals V, W, P and N (i.e., the current paths of the power transistors 1 to 6) with respect to the aluminum substrate 31, the malfunctions can be avoided in the way similar to the above. Since a capacitor of large capacity is generally connected between the terminals P and N to which a high voltage power source is connected, noise arises in the terminals P and N in just the same manner.

Figure 9:
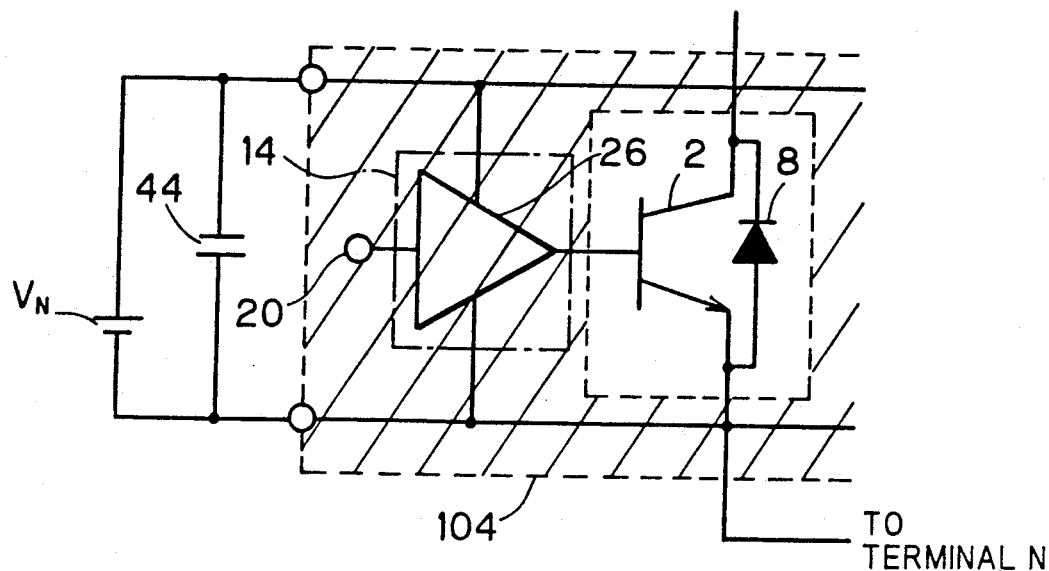
FIGS. 9 and 10 are circuit diagrams showing variations of the embodiment in FIG. 5, respectively.
Figure 10:
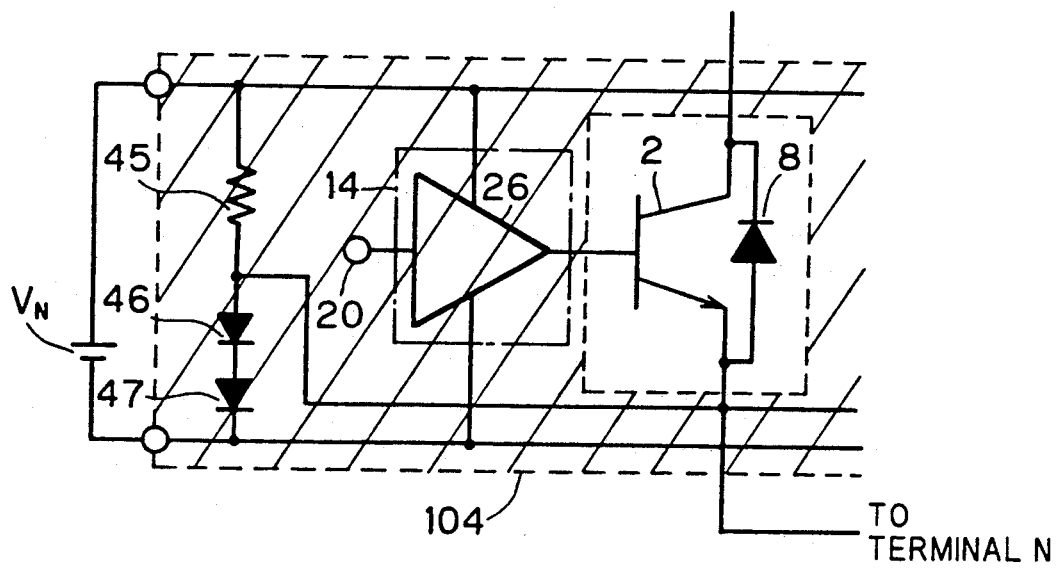

Although the shield patterns 101 to 104 are directly connected to the potentials of the output electrodes (emitters) of the corresponding power transistors 1 to 6 in the above embodiment, this is not necessarily required. For example, as shown in FIG. 9, when a capacitor 44 of relatively large capacity is connected between plus and minus terminals of the power source $V_N$, a potential on the plus side of the power source $V_N$ is varied in accordance with the noise arising in the emitter (i.e., the terminal N) of the power transistor 2. As shown in FIG. 10, in the case where a reverse bias circuit consisting of a resistance 45 and diodes 46 and 47 is connected to the emitter of the power transistor 2 to reversely bias the base of the power transistor 2 while it is in an OFF state and thus the emitter potential of the power transistor 2 is shifted up in level, noise arises in the minus side of the power source $V_N$ when noise arises in the emitter of the power transistor 2. The diodes 46 and 47 may be Zener diodes. The shield pattern 104 can exert the above-mentioned effect when fixed to a potential corresponding to the potential of the output electrode (emitter) of the power transistor 2, and hence it is not directly connected to the emitter of the power transistor 2 but may be connected, for example, to the plus side of the power source $V_N$ in the case of FIG. 9 or the minus side of the power source $V_N$ in the case of FIG. 10. This is the same with other shield patterns 101 to 103.

In an embodiment in FIG. 6, the shield patterns 101 and 104 are disposed on the aluminum substrate 31 preferably in any of the following ways. In a first way, the copper pattern 33 is first formed on the insulating layer 32. Then, a lamination structure in which the copper pattern 41 and the shield pattern 101 are formed on the upper and bottom surfaces of the insulating layer 105 and a lamination structure in which the copper pattern 41 and the shield pattern 104 are formed on the upper and bottom surfaces of the insulating layer 106 are made of double-side printed boards or the like, and they are placed in a predetermined positions on the insulating layer 32. In a second way, the copper pattern 33 and the shield patterns 101 and 104 are simultaneously formed on the insulating layer 32. Then, lamination structures having the copper pattern 41 on the surfaces of the insulating layers 105 and 106 are formed from a single-side printed boards or the like and placed on the shield patterns 101 and 104, respectively.

Figure 11:
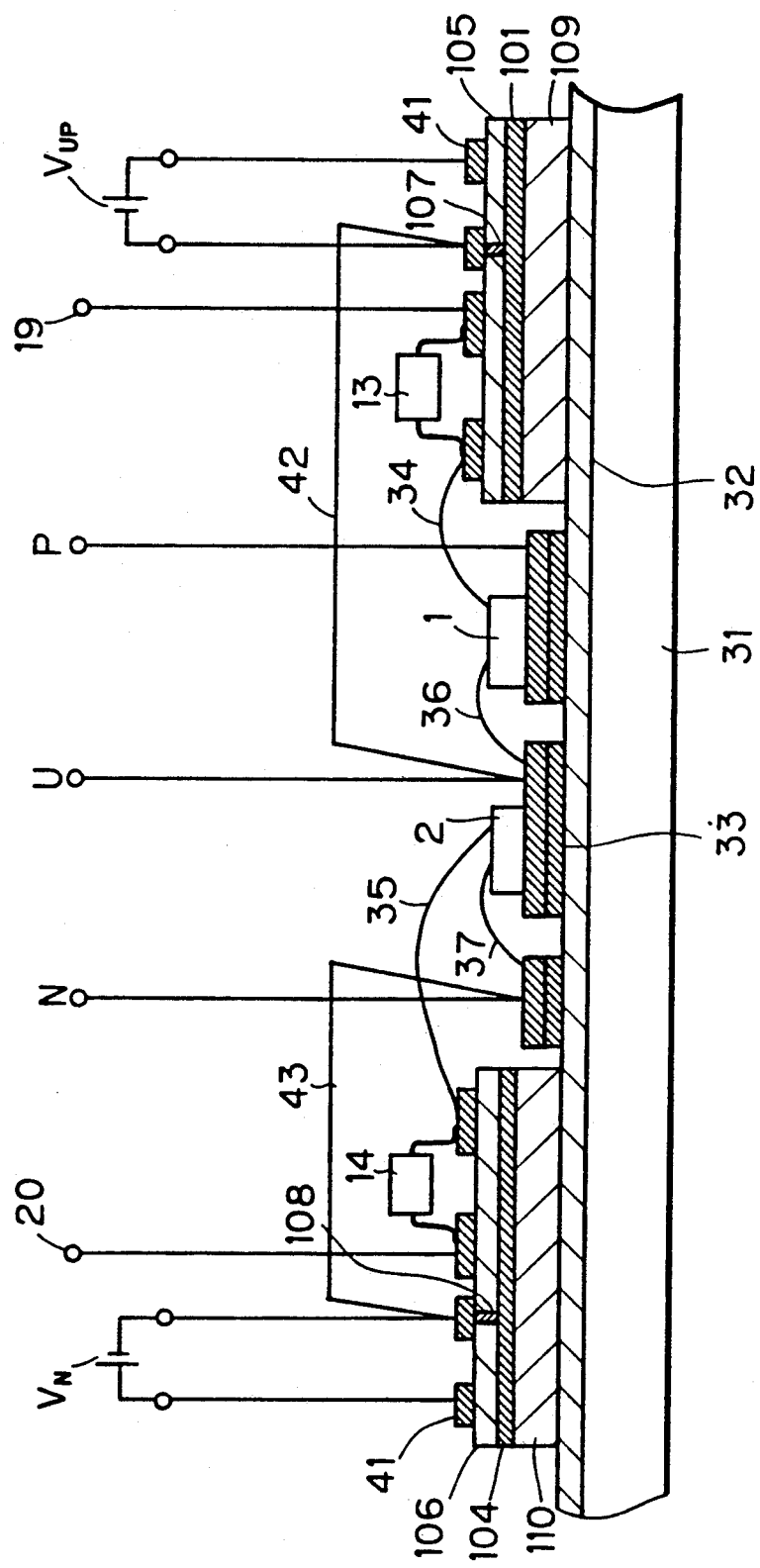
FIG. 11 is a sectional view showing another embodiment according to the present invention.

FIG. 11 is a sectional view showing another embodiment of the semiconductor device according to the present invention. Unlike the embodiment in FIG. 6, the shield patterns 101 and 104 are placed on relatively thick insulating layers 109 and 110 formed on the insulating layer 32, respectively. The copper patterns 33 for the power transistors 1 and 2 are formed relatively thick. Since large current flows in the power transistors 1 and 2, it is desirable that the copper patterns 33 are thick. The lamination structure consisting of the insulating layer 109, the shield pattern 101, the insulating layer 105 and the copper pattern 41 may be formed from a double-layer printed board or the like and placed in a predetermined position on the insulating layer 32. In accordance with the embodiment, there is the advantage that the lamination structure is laid over the copper pattern 33 so that area can be reduced.

In the above embodiment, the electrical connections through the through holes 107 and 108 as means for fixing the potentials of the shield patterns 101 and 104 have been described, but aluminum wire, soldering, short-circuiting parts consisting of a metal piece and the like may be used for the connections. In this case, removing a part of each of the insulating layers 105 and 106 to expose a part of each of the upper surfaces of the shield patterns 101 and 104, the connections can be easily carried out.

Although the case in which bipolar transistors are used as power switching devices has been described in conjunction with the above embodiments, power MOSFETs or insulated gate bipolar transistors (IGBTs) may be used. Transistors to be used are not limited to NPN transistors, but may be PNP transistors.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:
1. A semiconductor device, comprising:
   a metal substrate;
   a first insulating layer formed on said metal substrate;
   first and second power switching elements formed on said first insulating layer and connected to each other like a totem pole;
   first and second shield patterns composed of conductors formed on said first insulating layer;
   a second insulating layer formed on said first shield pattern;
   a third insulating layer formed on said second shield pattern;
   a first control circuit formed on said second insulating layer for turning said first power switching element ON/OFF;
   a second control circuit formed on said third insulating layer for turning said second power switching element ON/OFF;
   first connecting means for connecting said first shield pattern to a first node of a potential responsive to a potential of an output electrode of said first power switching element; and
   second connecting means for connecting said second shield pattern to a second node of a potential responsive to a potential of an output electrode of said second power switching element.

2. A semiconductor device in accordance with claim 1, further comprising
   a metal wiring pattern formed on said first insulating layer, wherein
   said first and second power switching elements are formed on said metal wiring pattern.

3. A semiconductor device in accordance with claim 1, further comprising
   first and second metal wiring patterns formed on said second and third insulating layers, respectively, wherein
   said first control circuit is formed on said first metal wiring pattern, and
   said second control circuit is formed on said second metal wiring pattern.

4. A semiconductor device in accordance with claim 1, wherein
   said second and third insulating layers are provided with first and second through holes, through which said first and second connecting means connect said first and second shield patterns to said first and second nodes, respectively.

5. A semiconductor device in accordance with claim 4, wherein
   said first and second connecting means include first and second metal wiring patterns formed in said first and second through holes, respectively.

6. A semiconductor device in accordance with claim 1, wherein
   said first and second nodes are output electrodes of said first and second power switching elements, respectively.

7. A semiconductor device in accordance with claim 1, wherein
   said first and second control circuits have high and low potential power source terminals, and
   said first and second nodes are said high potential power source terminals of said first and second control circuits, respectively.

8. A semiconductor device in accordance with claim 1, wherein
   said first and second control circuits have high and low potential power source terminals, and said first and second nodes are said low potential power source terminals of said first and second control circuits, respectively.

9. A semiconductor device in accordance with claim 1, wherein
said first and second shield patterns are larger in thickness than said second and third insulating layers.

10. A semiconductor device in accordance with claim 1, further comprising
third and fourth power switching elements formed on said first insulating layer and connected to each other like a totem pole;
third shield pattern composed of a conductor formed on said first insulating layer;
a fourth insulating layer formed on said third shield pattern;
a third control circuit formed on said fourth insulating layer for turning said third power switching element ON/OFF;
a fourth control circuit formed on said third insulating layer for turning said fourth power switching element ON/OFF;
third connecting means for connecting said third shield pattern to a third node of a potential responsive to a potential of an output electrode of said third power switching element.

* * * * *